United States Patent
Clyne et al.

(10) Patent No.: US 9,064,973 B2
(45) Date of Patent: *Jun. 23, 2015

(54) DIE ATTACHED TO A SUPPORT MEMBER BY A PLURALITY OF ADHESIVE MEMBERS

(75) Inventors: Craig T. Clyne, Boise, ID (US); John C. Fernandez, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/611,509

(22) Filed: Sep. 12, 2012

(65) Prior Publication Data

US 2013/0000842 A1 Jan. 3, 2013

Related U.S. Application Data

(63) Continuation of application No. 11/053,984, filed on Feb. 8, 2005, now Pat. No. 8,278,751.

(51) Int. Cl.
*H01L 23/48* (2006.01)
*H01L 21/00* (2006.01)
(Continued)

(52) U.S. Cl.
CPC .............. *H01L 24/83* (2013.01); *H01L 24/27* (2013.01); *H01L 24/29* (2013.01); *H01L 24/48* (2013.01); *H01L 25/0657* (2013.01); *H01L 25/50* (2013.01); *H01L 2224/2919* (2013.01); *H01L 2224/32145* (2013.01); *H01L 2224/32225* (2013.01); *H01L 2224/48091* (2013.01); *H01L 2224/48227* (2013.01); *H01L 2224/4824* (2013.01); *H01L 2224/73215* (2013.01); *H01L 2224/73265* (2013.01);
(Continued)

(58) Field of Classification Search
CPC ......... H01L 24/27; H01L 24/32; H01L 24/83; H01L 24/29; H01L 24/48; H01L 25/50; H01L 25/0657
See application file for complete search history.

(56) References Cited

U.S. PATENT DOCUMENTS

| | | | |
|---|---|---|---|
| 4,563,811 A | 1/1986 | Cranston | |
| 5,128,831 A | 7/1992 | Fox, III et al. | |

(Continued)

FOREIGN PATENT DOCUMENTS

| JP | 06287273 A | 10/1994 |
|---|---|---|
| JP | 07263382 A | 10/1995 |

OTHER PUBLICATIONS

Peter, Robert, "Ultra-low Profile Chip Scale Package Challenges for 300mm Die Bonder," Business Briefing: Global Semiconductor Manufacturing Technology, Aug. 2003, pp. 1-5.

(Continued)

*Primary Examiner* — Alonzo Chambliss
(74) *Attorney, Agent, or Firm* — Perkins Coie LLP

(57) ABSTRACT

Methods and systems for adhering microfeature workpieces to support members are disclosed. A method in accordance with one embodiment of the invention includes disposing a first adhesive on a surface of a microfeature workpiece, and disposing a second adhesive on a surface of a support member. The method can further include adhesively attaching the microfeature workpiece to the support member by contacting the first adhesive with the second adhesive while the second adhesive is only partially cured. In further particular embodiments, the first and second adhesives can have different compositions, and the second adhesive can be fully cured after the microfeature workpiece and support member are adhesively attached.

20 Claims, 3 Drawing Sheets

(51) Int. Cl.
*H01L 23/00* (2006.01)
*H01L 25/00* (2006.01)
*H01L 25/065* (2006.01)

(52) U.S. Cl.
CPC .............. *H01L 2224/83101* (2013.01); *H01L 2224/83193* (2013.01); *H01L 2224/83856* (2013.01); *H01L 2224/92247* (2013.01); *H01L 2225/06562* (2013.01); *H01L 2924/01005* (2013.01); *H01L 2924/01075* (2013.01); *H01L 2924/07802* (2013.01); *H01L 2924/15311* (2013.01); *H01L 2924/1532* (2013.01); H01L 24/32 (2013.01); *H01L 2924/01006* (2013.01); *H01L 2924/01033* (2013.01); *H01L 2924/014* (2013.01); *H01L 2924/0665* (2013.01); *H01L 2225/06568* (2013.01); *H01L 2224/29101* (2013.01); *H01L 2224/06135* (2013.01); *H01L 2224/06136* (2013.01); *Y10T 156/10* (2015.01)

(56) References Cited

U.S. PATENT DOCUMENTS

| | | |
|---|---|---|
| 5,139,973 A | 8/1992 | Nagy et al. |
| 5,208,188 A | 5/1993 | Newman |
| 5,252,857 A | 10/1993 | Kane et al. |
| 5,518,957 A | 5/1996 | Kim |
| 5,535,101 A | 7/1996 | Miles et al. |
| 5,593,927 A | 1/1997 | Farnworth et al. |
| 5,614,766 A | 3/1997 | Takasu et al. |
| 5,656,857 A | 8/1997 | Kishita |
| 5,677,566 A | 10/1997 | King et al. |
| 5,696,033 A | 12/1997 | Kinsman |
| 5,739,585 A | 4/1998 | Akram et al. |
| D394,844 S | 6/1998 | Farnworth et al. |
| D402,638 S | 12/1998 | Farnworth et al. |
| 5,851,845 A | 12/1998 | Wood et al. |
| 5,855,821 A | 1/1999 | Chau et al. |
| 5,866,953 A | 2/1999 | Akram et al. |
| 5,871,808 A | 2/1999 | Thompson, Sr. |
| 5,876,498 A | 3/1999 | Thompson, Sr. |
| 5,883,426 A | 3/1999 | Tokuno et al. |
| 5,891,753 A | 4/1999 | Akram |
| 5,893,726 A | 4/1999 | Farnworth et al. |
| 5,898,224 A | 4/1999 | Akram |
| 5,920,118 A | 7/1999 | Kong |
| 5,925,930 A | 7/1999 | Farnworth et al. |
| 5,933,713 A | 8/1999 | Farnworth |
| 5,938,956 A | 8/1999 | Hembree et al. |
| 5,946,553 A | 8/1999 | Wood et al. |
| 5,956,236 A | 9/1999 | Corisis et al. |
| 5,958,100 A | 9/1999 | Farnworth et al. |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 6,008,070 A | 12/1999 | Farnworth |
| 6,008,074 A | 12/1999 | Brand |
| 6,017,776 A | 1/2000 | Jiang et al. |
| 6,020,624 A | 2/2000 | Wood et al. |
| 6,020,629 A | 2/2000 | Farnworth et al. |
| 6,025,728 A | 2/2000 | Hembree et al. |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,051,878 A | 4/2000 | Akram et al. |
| 6,063,647 A | 5/2000 | Chen et al. |
| 6,072,233 A | 6/2000 | Corisis et al. |
| 6,072,236 A | 6/2000 | Akram et al. |
| 6,075,288 A | 6/2000 | Akram |
| 6,089,920 A | 7/2000 | Farnworth et al. |
| 6,097,087 A | 8/2000 | Farnworth et al. |
| 6,103,547 A | 8/2000 | Corisis et al. |
| 6,107,122 A | 8/2000 | Wood et al. |
| 6,107,680 A | 8/2000 | Hodges |
| 6,114,753 A | 9/2000 | Nagai et al. |
| 6,114,769 A | 9/2000 | Thompson, Sr. |
| 6,117,382 A | 9/2000 | Thummel |
| 6,118,176 A | 9/2000 | Tao et al. |
| 6,124,634 A | 9/2000 | Akram et al. |
| 6,133,066 A | 10/2000 | Murakami |
| 6,150,717 A | 11/2000 | Wood et al. |
| 6,153,924 A | 11/2000 | Kinsman |
| 6,159,764 A | 12/2000 | Kinsman et al. |
| 6,172,419 B1 | 1/2001 | Kinsman |
| 6,175,149 B1 | 1/2001 | Akram |
| 6,175,159 B1 | 1/2001 | Sasaki |
| 6,184,465 B1 | 2/2001 | Corisis |
| 6,194,250 B1 | 2/2001 | Melton et al. |
| 6,198,172 B1 | 3/2001 | King et al. |
| 6,208,519 B1 | 3/2001 | Jiang et al. |
| 6,210,992 B1 | 4/2001 | Tandy et al. |
| 6,212,767 B1 | 4/2001 | Tandy |
| 6,215,175 B1 | 4/2001 | Kinsman |
| 6,218,731 B1 | 4/2001 | Huang et al. |
| 6,225,689 B1 | 5/2001 | Moden et al. |
| 6,228,548 B1 | 5/2001 | King et al. |
| 6,229,202 B1 | 5/2001 | Corisis |
| 6,235,554 B1 | 5/2001 | Akram et al. |
| 6,246,108 B1 | 6/2001 | Corisis et al. |
| 6,252,308 B1 | 6/2001 | Akram et al. |
| 6,258,623 B1 | 7/2001 | Moden et al. |
| 6,258,624 B1 | 7/2001 | Corisis |
| 6,259,153 B1 | 7/2001 | Corisis |
| 6,261,865 B1 | 7/2001 | Akram |
| 6,271,058 B1 | 8/2001 | Yoshida |
| 6,277,671 B1 | 8/2001 | Tripard |
| 6,281,577 B1 | 8/2001 | Oppermann et al. |
| 6,284,571 B1 | 9/2001 | Corisis et al. |
| 6,291,894 B1 | 9/2001 | Farnworth et al. |
| 6,294,839 B1 | 9/2001 | Mess et al. |
| 6,297,547 B1 | 10/2001 | Akram |
| 6,303,981 B1 | 10/2001 | Moden |
| 6,303,985 B1 | 10/2001 | Larson et al. |
| 6,310,288 B1 | 10/2001 | Moden |
| 6,310,390 B1 | 10/2001 | Moden |
| 6,312,977 B1 | 11/2001 | Jiang et al. |
| 6,314,639 B1 | 11/2001 | Corisis |
| 6,316,285 B1 | 11/2001 | Jiang et al. |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,331,221 B1 | 12/2001 | Cobbley |
| 6,331,453 B1 | 12/2001 | Bolken et al. |
| 6,332,766 B1 | 12/2001 | Thummel |
| 6,333,564 B1 | 12/2001 | Katoh et al. |
| 6,342,728 B2 | 1/2002 | Miyazaki et al. |
| 6,365,434 B1 | 4/2002 | Rumsey et al. |
| 6,385,049 B1 | 5/2002 | Chia-Yu et al. |
| 6,396,129 B1 | 5/2002 | Hung et al. |
| 6,400,033 B1 | 6/2002 | Darveaux |
| 6,429,528 B1 | 8/2002 | King et al. |
| 6,448,635 B1 | 9/2002 | Glenn |
| 6,451,709 B1 | 9/2002 | Hembree |
| 6,455,354 B1 | 9/2002 | Jiang |
| 6,479,323 B1 | 11/2002 | Lo et al. |
| 6,501,170 B1 | 12/2002 | Dickey et al. |
| 6,528,408 B2 | 3/2003 | Kinsman |
| 6,528,722 B2 | 3/2003 | Huang et al. |
| 6,541,872 B1 | 4/2003 | Schrock et al. |
| 6,548,376 B2 | 4/2003 | Jiang |
| 6,548,757 B1 | 4/2003 | Russell et al. |
| 6,552,910 B1 | 4/2003 | Moon et al. |
| 6,558,600 B1 | 5/2003 | Williams et al. |
| 6,560,117 B2 | 5/2003 | Moon et al. |
| 6,561,479 B1 | 5/2003 | Eldridge |
| 6,564,979 B2 | 5/2003 | Savaria |
| 6,576,494 B1 | 6/2003 | Farnworth |

(56) References Cited

U.S. PATENT DOCUMENTS

| | | |
|---|---|---|
| 6,576,495 B1 | 6/2003 | Jiang et al. |
| 6,589,820 B1 | 7/2003 | Bolken |
| 6,592,783 B2 | 7/2003 | Kumakura et al. |
| 6,607,937 B1 | 8/2003 | Corisis |
| 6,614,092 B2 | 9/2003 | Eldridge et al. |
| 6,622,380 B1 | 9/2003 | Grigg |
| 6,638,595 B2 | 10/2003 | Rumsey et al. |
| 6,644,949 B2 | 11/2003 | Rumsey et al. |
| 6,653,173 B2 | 11/2003 | Bolken |
| 6,656,769 B2 | 12/2003 | Lee et al. |
| 6,661,104 B2 | 12/2003 | Jiang et al. |
| 6,664,139 B2 | 12/2003 | Bolken |
| 6,670,719 B2 | 12/2003 | Eldridge et al. |
| 6,672,325 B2 | 1/2004 | Eldridge |
| 6,673,649 B1 | 1/2004 | Hiatt et al. |
| 6,724,076 B1 | 4/2004 | Kahlisch et al. |
| 6,770,164 B1 | 8/2004 | Schrock et al. |
| 6,844,618 B2 | 1/2005 | Jiang et al. |
| 6,900,080 B2 | 5/2005 | Jiang et al. |
| 6,906,424 B2 | 6/2005 | Kinsman |
| 7,109,061 B2 * | 9/2006 | Crane et al. .................... 438/118 |
| 7,518,237 B2 * | 4/2009 | Clyne et al. .................... 257/724 |
| 2002/0074645 A1 | 6/2002 | Dickey et al. |
| 2002/0160185 A1 | 10/2002 | Nagai et al. |
| 2003/0134451 A1 | 7/2003 | Chen |
| 2003/0189262 A1 | 10/2003 | Jiang |
| 2004/0067606 A1 | 4/2004 | Fehr et al. |
| 2004/0159942 A1 | 8/2004 | Kinsman |
| 2004/0265549 A1 | 12/2004 | Kydd |
| 2005/0006743 A1 | 1/2005 | Kim et al. |
| 2005/0016751 A1 | 1/2005 | Jiang et al. |
| 2005/0019988 A1 | 1/2005 | Jiang |
| 2005/0230821 A1 | 10/2005 | Kheng |
| 2006/0177970 A1 | 8/2006 | Clyne et al. |
| 2006/0189036 A1 | 8/2006 | Clyne et al. |
| 2008/0088036 A1 * | 4/2008 | Matsumura et al. .......... 257/783 |

OTHER PUBLICATIONS

Webster's II New College Dictionary, pp. 242-243, Houghton Mifflin Company, Boston, 1995, ISBN 0-395-70869-9.

* cited by examiner

DIE ATTACHED TO A SUPPORT MEMBER BY A PLURALITY OF ADHESIVE MEMBERS

CROSS-REFERENCE TO RELATED APPLICATIONS

This application is a continuation of U.S. application Ser. No. 11/053,984 filed Feb. 8, 2005, now U.S. Pat. No. 8,278,751, and is related to U.S. application Ser. No. 11/407,560 filed Apr. 19, 2006, now U.S. Pat. No. 7,518,237, each of which is incorporated herein by reference in its entirety.

TECHNICAL FIELD

The present invention relates generally to methods and systems for adhering microfeature workpieces to support members.

BACKGROUND

Packaged microelectronics assemblies, such as memory chips and microprocessor chips, typically include a microelectronic die mounted to a substrate and encased in a plastic protective covering. The die includes functional features, such as memory cells, processor circuits and interconnecting circuitry. The die also typically includes bond pads electrically coupled to the functional features. The bond pads are electrically connected to pins or other types of terminals that extend outside the protective covering for connecting the die to buses, circuits, and/or other microelectronic assemblies.

In one conventional arrangement, the die is mounted to a supporting substrate (e.g., a printed circuit board), and the die bond pads are electrically coupled to corresponding bond pads of the substrate with wire bonds. After encapsulation, the substrate can be electrically connected to external devices. Accordingly, the substrate supports the die and provides an electrical link between the die and the external devices.

Prior to encapsulation, the microelectronic die is typically attached to the substrate with an adhesive. For example, one conventional assembly includes a wafer backside laminate (WBL) that adheres the microelectronic die to the substrate. Other assemblies include an epoxy that adheres the microelectronic die to the substrate. The foregoing adhesion techniques have both advantages and drawbacks. For example, a WBL generally increases the strength of the die, but does not fill in surface features on the substrate. Accordingly, the bond formed between the die and the substrate may fail due to an inadequate adhesive bond. Epoxies tend to flow more than WBLs do and can accordingly fill such features, but epoxies can fail in shear at the junction between the epoxy and the die, and/or at the junction between the epoxy and the substrate. Accordingly, it is desirable to adhere dies to substrates in a more robust manner.

DETAILED DESCRIPTION

Figure 1:
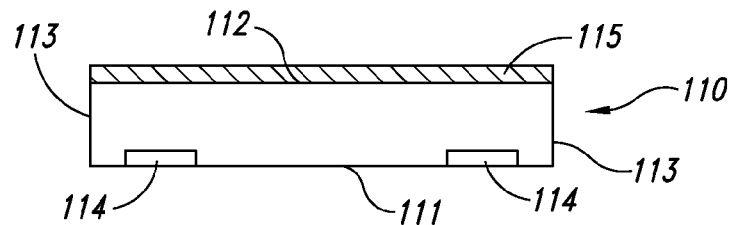
FIG. 1 illustrates a microfeature workpiece having a first adhesive in accordance with an embodiment of the invention.

The present invention relates generally to microfeature dies and methods for adhering such dies to support members, for example, printed circuit boards. A method for attaching a microfeature workpiece to a support member in accordance with one aspect of the invention includes disposing a first adhesive on a surface of the microfeature workpiece and disposing a second adhesive on a surface of the support member. The method can further include adhesively attaching the microfeature workpiece to the support member by contacting the first adhesive with the second adhesive while the second adhesive is only partially cured. For example, the method can include attaching a film adhesive to the microfeature workpiece, and stenciling a liquid epoxy on the support member. The method can further include partially curing the epoxy (for example, to B-stage) before attaching the microfeature workpiece to the support member by contacting the two adhesives with each other. The method can include further curing the second adhesive to complete the bond between the microfeature workpiece and the support member.

In particular embodiments, the microfeature workpiece can have a first major surface, a second major surface facing opposite from the first major surface, and an edge surface between the first and second major surfaces. The method can further comprise electrically coupling the support member to the microfeature workpiece at the second major surface of the workpiece. In still a further aspect of the invention, the microfeature workpiece can be attached to the support member without either the first adhesive or the second adhesive contacting the edge surface of the microfeature workpiece.

A method in accordance with another aspect of the invention includes stiffening a microfeature workpiece by disposing a first adhesive layer on a surface of the microfeature workpiece, with the first adhesive layer having a first composition. The method can further include filling voids in a surface of a support member by disposing a second adhesive layer on a surface of the support member, with the second adhesive layer having a second composition different than the first composition. The method can still further include adhesively attaching the microfeature workpiece to the support member by contacting the first adhesive layer with the second adhesive layer.

Other aspects of the invention are directed toward microfeature workpiece systems or assemblies. A system in accordance with one aspect of the invention includes a microfeature workpiece having a first major surface, a second major surface facing away from the first major surface, and an edge surface between the first and second major surfaces. The system can further include a support member positioned adjacent to the microfeature workpiece, and an adhesive assembly attached between the microfeature workpiece and the support member. The adhesive assembly can include a first layer having a first composition and a first generally uniform thickness, a second layer having a second composition different than the first with a second generally uniform thickness. In further specific aspects, the adhesive assembly can be generally out of contact with the edge surface of the microfeature workpiece, and the microfeature workpiece can be electrically coupled to the support member with an electrical coupling connected between the support member and the second major surface of the microfeature workpiece.

FIG. 1 is a partially schematic, cross-sectional side view of a microfeature workpiece 110 that can be attached to a support member to form an assembly (e.g., a package) in accordance with an embodiment of the invention. The microfeature workpiece 110 can have a first major surface 111, a second major surface 112 facing generally opposite from the first major surface 111, and an edge surface 113 between the first and second major surfaces 111, 112. The microfeature workpiece 110 can include a microelectronic die that has been separated from a larger substrate, e.g., a semiconductor wafer. The microfeature workpiece 110 can accordingly include internal microelectronic features and structures (not visible in FIG. 1) that are electrically coupled to workpiece bond pads 114. The bond pads 114 can provide for electrical communication between features and structures within the microfeature workpiece 110, and components and structures external to the microfeature workpiece 110.

The microfeature workpiece 110 can include a first adhesive 115 adhesively attached to the second surface 112, and configured to bond the microfeature workpiece 110 to a support member. In one embodiment, the first adhesive 115 can include a wafer backside laminate (WBL) that is applied to the microfeature workpiece 110 at the wafer level (e.g., before the microfeature workpiece 110 is separated or diced from a larger wafer or other substrate). For example, a sheet of the first adhesive 115 can initially be carried by a dicing frame and attached to a wafer. The wafer attachment process can occur at an elevated temperature (e.g., 40° C.-80° C.) and/or pressure (e.g., 20-50 psi). After dicing the wafer, a small portion of the first adhesive 115 remains attached to each microfeature workpiece 110, and a standard pick and place process can be used to move the microfeature workpiece 110. The first adhesive 115 can include a film substrate having adhesive material attached to both opposing surfaces of the film (e.g., a double-backed adhesive film). In another embodiment, the first adhesive 115 can be a monolayer, e.g., a single layer of adhesive applied to the second surface 112 of the microfeature workpiece 110. Suitable first adhesives are available from Ablestick Laboratories of Rancho Dominguez, Calif. under part number RP787-3DS, and from the Hitachi Chemical Company Ltd. of Tokyo, Japan under part number FH-800.

The first adhesive 115 can act not only to adhere the microfeature workpiece 110 to a support member, but also to stiffen the microfeature workpiece 110. As a result, the microfeature workpiece 110 can be less likely to break during normal handling operations. This can be particularly important for very thin microfeature workpieces 110, which may be more susceptible to such breakage. Such microfeature workpieces 110 can have a thickness of 150 microns or less, e.g., 100 microns or less.

FIGS. 2A-2F illustrate a support member 220 and a method for attaching the support member 220 to the microfeature workpiece 110 described above with reference to FIG. 1. Beginning with FIG. 2A, the support member 220 can include a printed circuit board or other suitable structure having provisions for electrical connections to the microfeature workpiece 110 (FIG. 1). For example, the support member 220 can include first bond pads 221 at a first surface 227, second bond pads 222 at an opposite, second surface 228, and internal conductive structures (not visible in FIG. 2A) coupling the first bond pads 221 to the second bond pads 222. In preparation for applying an adhesive to the support member 220, a stencil 223 can be positioned adjacent to the first surface 227. The stencil 223 can include one or more openings 224 sized in accordance with the desired attachment surface area between the support member 220 and the microfeature workpiece 110.

Figure 2A:
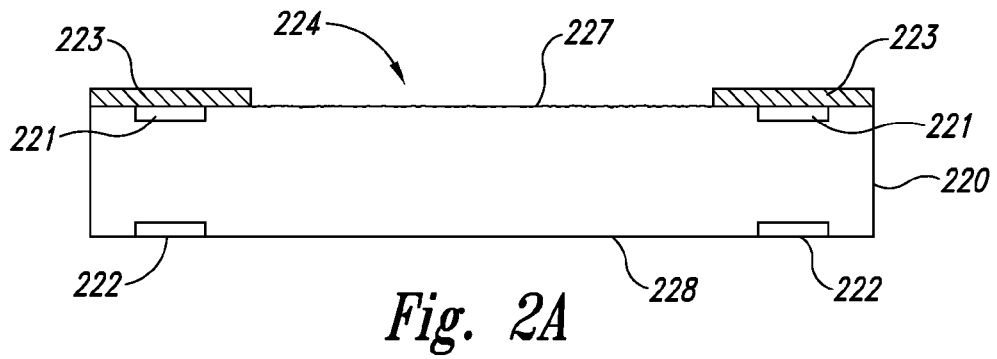
FIGS. 2A-2F illustrate a process for manufacturing a microfeature workpiece assembly using first and second adhesives in accordance with an embodiment of the invention.
Figure 2B:
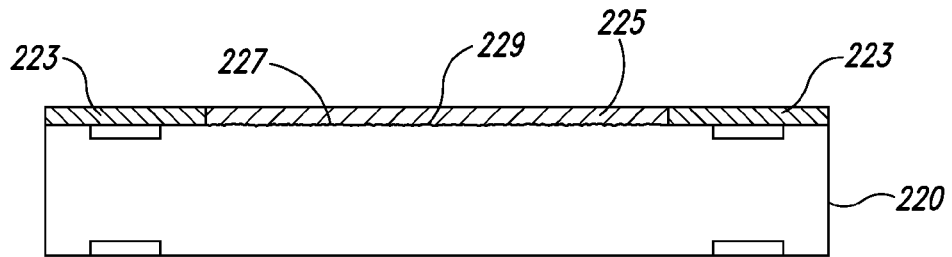

Referring next to FIG. 2B, a second adhesive 225 can be applied to the support member 220 in a stenciling process. Accordingly, the second adhesive 225 can be distributed over the stencil 223 using techniques well-known to those of ordinary skill in the relevant art to fill the opening 224. In one aspect of this embodiment, the second adhesive 225 can include an epoxy that is applied to the support member 220 when in a liquid or otherwise generally flowable state. Accordingly, the second adhesive 225 can readily fill the opening 224 in the stencil 223. The second adhesive 225 can also readily fill gaps, recesses, projections, roughness elements, and/or other surface features 229 in the first surface 227 of the support member 220. As a result, the second adhesive 225 can be in intimate contact with the surface features 229 to provide a robust bond with the support member 220.

Figure 2C:
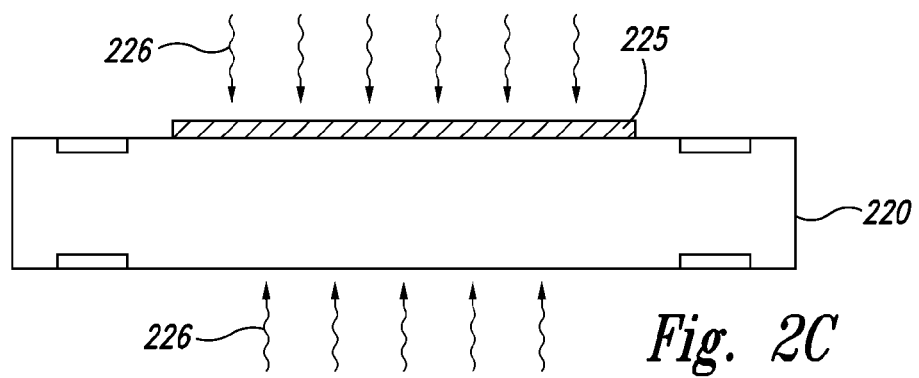

In FIG. 2C, the stencil 223 is removed and the second adhesive 225 can be partially cured. The process of partially curing the second adhesive 225 can include applying heat 226 and, optionally, pressure, to the second adhesive 225. For example, the temperature of the second adhesive can be elevated to about 100° C. for about one hour, at atmospheric pressure, in an inert (e.g., nitrogen) environment. When the second adhesive 225 includes an epoxy, the partial curing process shown in FIG. 2C can include forming a B-stage epoxy. As used herein, the term "B-stage" includes, but is not necessarily limited to, an intermediate stage in the reaction of a thermosetting resin in which the material softens when heated and swells when in contact with certain liquids, but does not entirely fuse or dissolve. In this stage, the second adhesive 225 is generally non-tacky (e.g., tack-free). Suitable epoxies include Sumitomo X2225 available from Sumitomo Electric Industries, Ltd. of Osaka, Japan, and Ablestik RP809-1A available from Ablestik Laboratories of Rancho Dominguez, Calif.

Figure 2D:
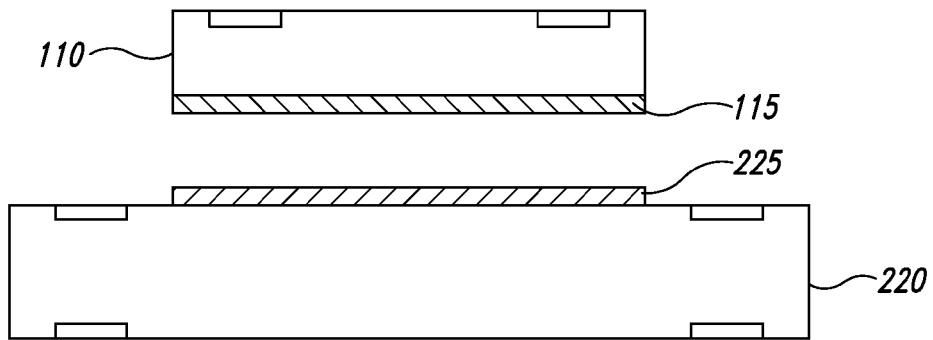
Figure 2E:
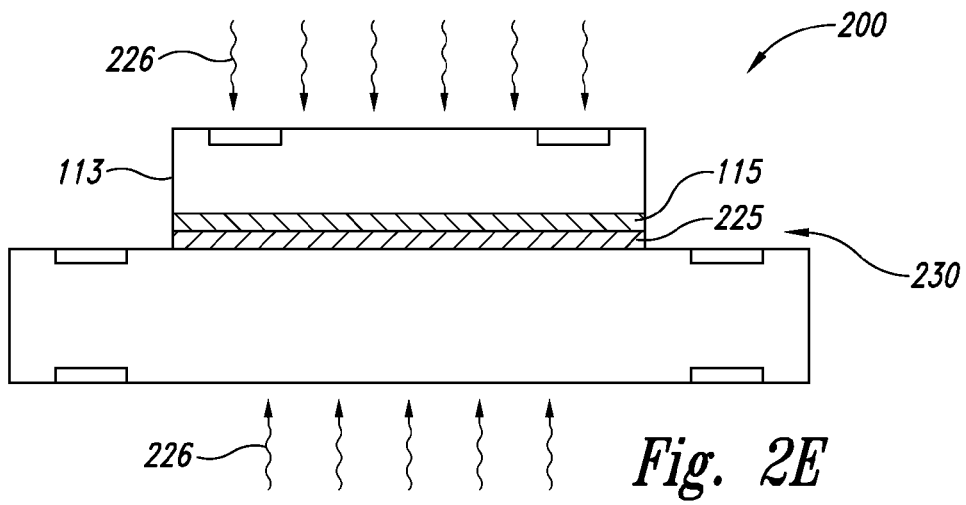

Referring next to FIG. 2D, the microfeature workpiece 110 can be positioned proximate to the support member 220, with the first adhesive 115 of the microfeature workpiece 110 facing toward the second adhesive 225 of the support member 220. The microfeature workpiece 110 and the support member 220 can be moved toward each other so that the first adhesive 115 contacts the second adhesive 225. The local temperature can be elevated (e.g., up to 100° C.-150° C.) for 1-3 seconds to "re-tack" the first and second adhesives 115, 125. The local pressure can also be elevated (e.g., by from about 1 g/mm$^2$ to about 8 g/mm$^2$) in a standard air environment. FIG. 2E illustrates the microfeature workpiece 110 with its first adhesive 115 contacting the second adhesive 225 of the support member 220. At this point, the second adhesive 225 can be fully cured by applying heat 226 (and optionally, pressure) to the second adhesive 225 to form an adhesive assembly 230 that includes both the first adhesive 115 and the second adhesive 225. In one embodiment, the adhesive assembly can be cured at 100° C.-150° C. for 1-2 hours in an inert environment. The resulting combination of the microfeature workpiece 110, the support member 220, and the adhesive assembly 230 forms an overall assembly or system 200 (e.g., a microfeature package).

Figure 2F:
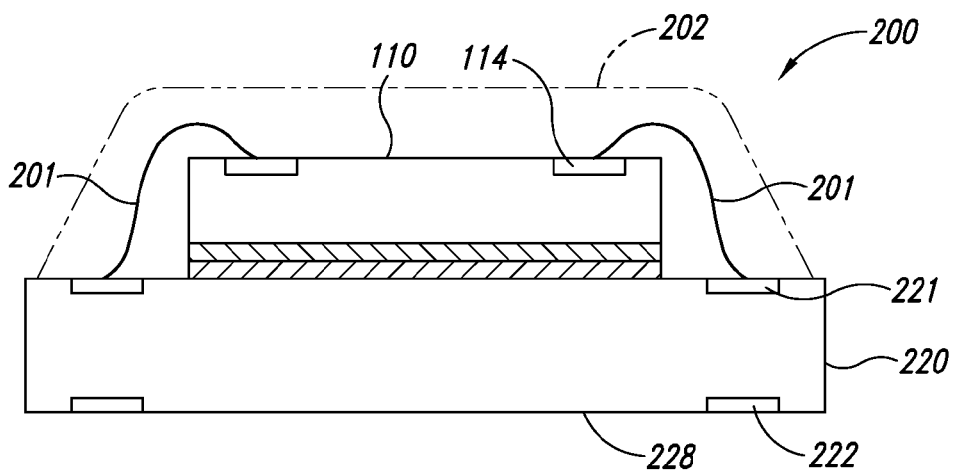

Referring next to FIG. 2F, the assembly 200 can include electrical couplings between the microfeature workpiece 110 and the support member 220. For example, the assembly 200 can include wirebonds 201 extending between the workpiece bond pads 114 and the first bond pads 221 of the support member 220. The assembly 200 can optionally include an encapsulant 202 that at least partially surrounds the microfeature workpiece 110 and the wirebonds 201 or other electrical couplings between the microfeature workpiece 110 and the support member 220. The completed assembly 200 can be electrically coupled to other components via the second bond pads 222 located at the second surface 228 of the support member 220.

One feature of embodiments of the assembly 200 described above with reference to FIGS. 1-2F is that they can include multiple adhesives. A further particular feature of at least some of these embodiments is that an adhesive having a first composition can be positioned adjacent to the microfeature workpiece 110, and an adhesive having a second, different composition can be positioned adjacent to the support member 220. This combination of adhesives can provide one or more of several advantages. For example, the first adhesive 115 can stiffen and strengthen the microfeature workpiece 110 and can accordingly reduce or eliminate the tendency for the microfeature workpiece 110 to warp, chip, and/or deform in other manners. Preventing the microfeature workpiece 110 from warping can be particularly important for workpieces 110 having high aspect ratios, e.g., about 4:1, 5:1 or up to 10:1. The second adhesive 225, on the other hand, can more readily fill in the surface features 229 of the support member 220. Accordingly, the second adhesive can be less likely to leave air voids or other imperfections that may reduce the bond strength between the second adhesive 225 and the support member 220.

Another feature of at least some of the foregoing embodiments is that each of the adhesive layers can have a generally uniform thickness. For example, the first adhesive 115 can have the form of a generally uniform film. The second adhesive 225 can be applied with a generally uniform thickness by using the stencil 223. Because each adhesive layer has a generally uniform thickness, the microfeature workpiece 110 will be less likely to be tilted relative to the support member 220. An advantage of this arrangement is that it can reduce the likelihood for the microfeature workpiece 110 (and/or the wirebonds 201) to be exposed through the encapsulant 202 as a result of the microfeature workpiece 110 being tilted or otherwise misaligned relative to the support member 220.

Another feature associated with embodiments of the generally uniform layer thicknesses described above is that the adhesive assembly 230 can be attached directly between the support member 240 and the second surface 112 of the microfeature workpiece 110, without extending along the edge surfaces 113 of the microfeature workpiece 110. An advantage of this "fillet-less" arrangement is that the adhesive assembly 230 may be less likely to subject the edge surfaces 113 of the microfeature workpiece 110 to stresses that can crack or otherwise damage the microfeature workpiece 110.

Still another advantage of at least some of the foregoing embodiments is that the adhesive assembly 230, formed from adhesives having different chemical constituencies, can form a tight bond with both the microfeature workpiece 110 and the support member 220. When subjected to excessive stresses, the failure mode of the adhesive assembly 230 can be cohesive rather than adhesive. For example, the adhesive assembly 230 can fail internally rather than at the interfaces between the adhesive assembly 230 and either the microfeature workpiece 110 or the support member 220. Because higher stresses are typically required for failure in the cohesive mode than in the adhesive mode, the overall strength of the bond between the support member 220 and the microfeature workpiece 110 can be greater than it is for existing adhesive arrangements.

Yet another feature of the foregoing embodiments is that the adhesive assembly 230 can produce a bond that more readily withstands typical moisture sensitivity testing environments. Such environments typically include transitions in temperature up to about 260° C., and an elevated humidity. Improved moisture sensitivity can also result in lower package stresses in challenging environmental conditions. As a result of any of the foregoing features, the package 200 can be more robust than existing packages, and can accordingly be more reliable in a wider variety of applications.

Figure 3:
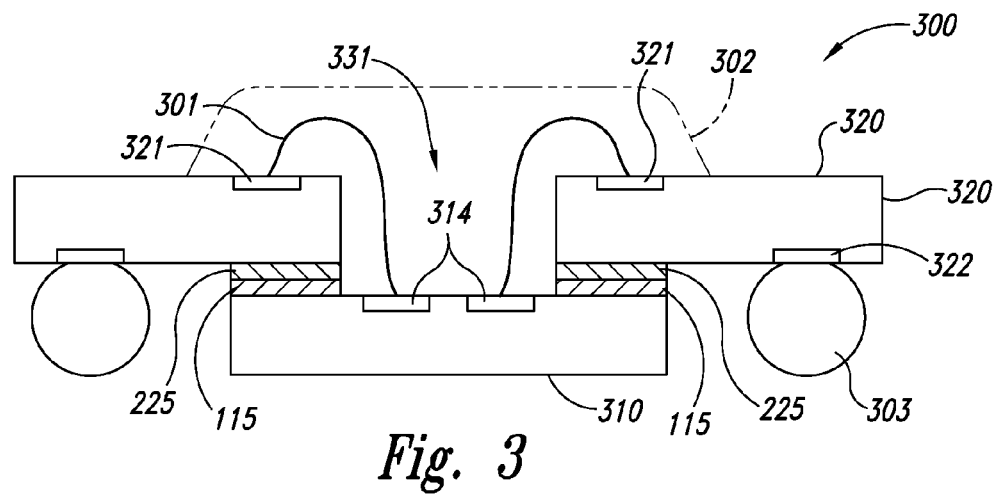
FIG. 3 is a partially schematic illustration of a microfeature workpiece attached to a support member in accordance with another embodiment of the invention.

Methods and adhesive assemblies at least generally similar to those described above with reference to FIGS. 1-2F can be used to bond microfeature workpieces to support members in other configurations as well. Referring now to FIG. 3, a microfeature workpiece assembly 300 can include a microfeature workpiece 310 having centrally located workpiece bond pads 314 in accordance with another embodiment of the invention. A corresponding support member 320 can include an aperture 331 aligned with the workpiece bond pads 314. The first adhesive 115 can be positioned adjacent to the microfeature workpiece 310 (outwardly from the workpiece bond pads 314), and the second adhesive 225 can be positioned adjacent to the support member 320 (outwardly from the aperture 331). After the second adhesive 225 has been partially cured, the microfeature workpiece 310 can be bonded to the support member 320 using a second curing process. The workpiece bond pads 314 can then be electrically coupled (e.g., with wirebonds 301) to first bond pads 321 of the support member 320. The resulting connection can be at least partially surrounded with an encapsulant 302. The first bond pads 321 can be electrically coupled to second bond pads 322, which can in turn provide communication with other devices, for example, via solder balls 303.

Figure 4:
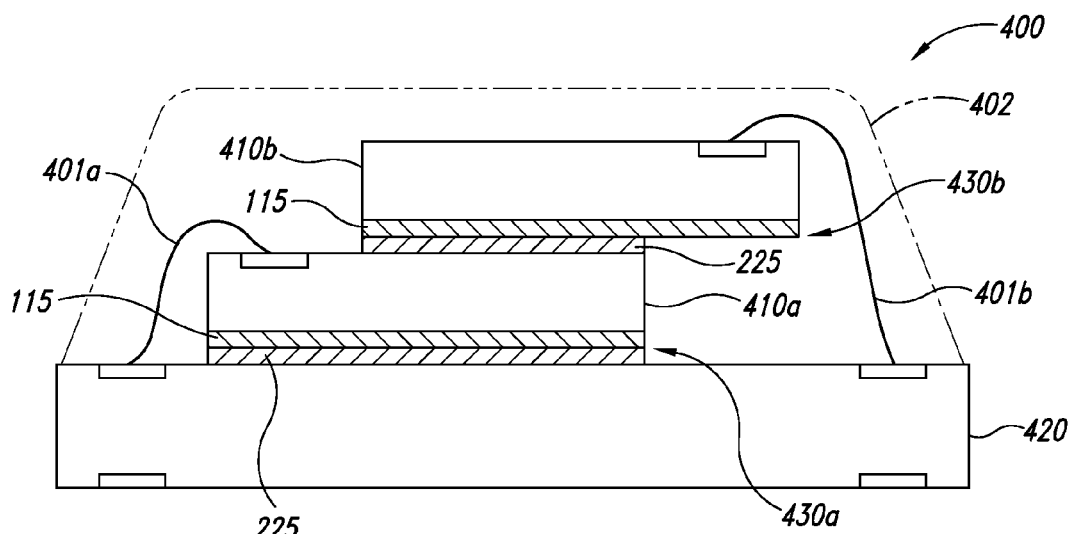
FIG. 4 is a partially schematic illustration of a support member carrying two microfeature workpieces in accordance with another embodiment of the invention.

FIG. 4 illustrates a microfeature workpiece package or assembly 400 that includes two microfeature workpieces 410, shown as a first microfeature workpiece 410a and a second microfeature workpiece 410b. The first microfeature workpiece 410a can be adhesively secured to a support member 420 with a first adhesive assembly 430a. The first adhesive assembly 430a can include a first adhesive 115 and a second adhesive 225, configured in a manner generally similar to that described above. The second microfeature workpiece 410b can be adhered directly to the first microfeature workpiece 410a with a second adhesive assembly 430b that also includes a portion of the first adhesive 115 and the second adhesive 225. First wirebonds 401a can electrically couple the first microfeature workpiece 410a to the support member 420, and second wirebonds 401b can electrically couple the second microfeature workpiece 410b to the support member 420. The entire package 400 can be surrounded by an encapsulant 402.

Figure 5:
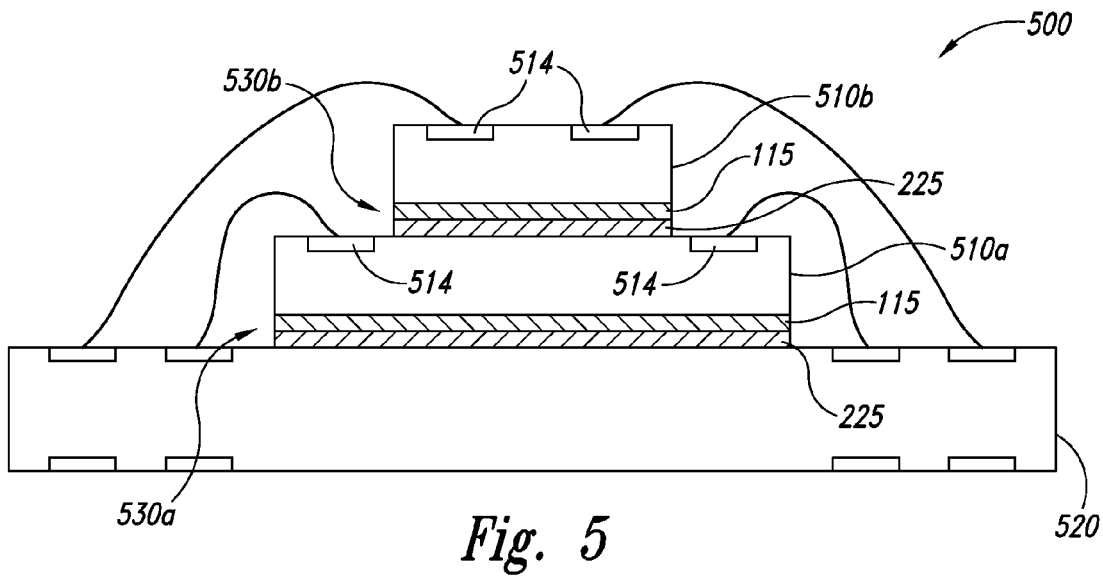
FIG. 5 is a partially schematic illustration of a support member carrying two microfeature workpieces in accordance with still another embodiment of the invention.

In one aspect of an embodiment shown in FIG. 4, the first microfeature workpiece 410a can have a configuration generally similar to that of the second microfeature workpiece 410b, and the second microfeature workpiece 410b can overhang the first microfeature workpiece 410a to allow for electrical coupling to both microfeature workpieces. In other embodiments, multiple microfeature workpieces can be stacked in other configurations. For example, referring now to FIG. 5, a package 500 can include a first microfeature workpiece 510a and a second, smaller microfeature workpiece 510b, stacked upon the first microfeature workpiece 510a. This arrangement allows bond pads 514 on the outer edges of each microfeature workpiece 510 to remain exposed despite the adhesive connection between the two microfeature workpieces. The first microfeature workpiece 510a can be secured to a support member 520 with a first adhesive assembly 530a, and the second microfeature workpiece 510b can be secured to the first microfeature workpiece 510a with a second adhesive assembly 530b. Each adhesive assembly 530a, 530b can include the first adhesive 115 and the second adhesive 225. In other embodiments, arrangements generally similar to those described above can be used to attach one or more microfeature workpieces to corresponding support members and/or other microfeature workpieces.

From the foregoing, it will be appreciated that specific embodiments of the invention have been described herein for purposes of illustration, but that various modifications may be made without deviating from the spirit and scope of the invention. For example, the microfeature workpiece can be electrically coupled to a corresponding support member with an electrical link other than a wirebond. Aspects of the invention described in the context of particular embodiments may be combined or eliminated in other embodiments. Although advantages associated with certain embodiments of the invention have been described in the context of those embodiments, other embodiments may also exhibit such advantages. Additionally, none of the foregoing embodiments need necessarily exhibit such advantages to fall within the scope of the invention. Accordingly, the invention is not limited except as by the appended claims.

We claim:

1. A microfeature workpiece assembly, comprising:
    a microfeature workpiece including a microelectronic die, the microfeature workpiece having a first major surface, a second major surface facing away from the first major surface, and an edge surface between the first and second major surfaces;
    a support member having a support surface facing toward the second major surface of the microfeature workpiece;
    an adhesive structure including
        a wafer backside laminate directly attached to the second major surface at a first interface, the wafer backside laminate including a film substrate having opposing major surfaces and adhesive material attached to both of the opposing major surfaces, and
        an adhesive layer directly attached to the support surface of the support member at a second interface; and
    an electrical coupling extending between the microfeature workpiece and the support member,
    wherein
        the wafer backside laminate and the adhesive layer are distinct structures bonded to one another, and
        the adhesive structure is configured to preferentially fail at a location between the first and second interfaces.

2. The assembly of claim 1 wherein the adhesive layer is infiltrated into surface features of the support surface of the support member to a greater extent than the wafer backside laminate is infiltrated into surface features of the second major surface of the microfeature workpiece.

3. The assembly of claim 1 wherein the wafer backside laminate is directly attached to the adhesive layer.

4. The assembly of claim 1 wherein the adhesive structure is out of contact with the edge surface.

5. The assembly of claim 1 wherein a failure mode of the assembly between the second major surface of the microfeature workpiece and the support surface of the support member is cohesive.

6. The assembly of claim 1 wherein the adhesive layer is configured to infiltrate surface features of the support surface.

7. The assembly of claim 6 wherein the adhesive layer includes an epoxy.

8. The assembly of claim 1 wherein the adhesive layer is in a stenciled pattern on the support surface of the support member.

9. The assembly of claim 1 wherein the wafer backside laminate is flat.

10. The assembly of claim 9 wherein the adhesive layer is flat.

11. The assembly of claim 1 wherein the electrical coupling is a wire bond.

12. A microfeature workpiece assembly, comprising:
    a microfeature workpiece including a microelectronic die, the microfeature workpiece having a first major surface, a second major surface facing away from the first major surface, and an edge surface between the first and second major surfaces;
    a support member having a support surface facing toward the second major surface;
    an adhesive structure directly attached to the second major surface via a first bond and directly attached to the support surface via a second bond, the adhesive structure including
        an internal bond positioned between the first and second bonds, the internal bond being weaker than the first bond and weaker than the second bond,
        a double-backed film adhesive positioned toward the microfeature workpiece, and
        a flowable adhesive positioned toward the support member; and
    an electrical coupling extending between the microfeature workpiece and the support member.

13. The assembly of claim 12 wherein the internal bond is a cohesive bond.

14. The assembly of claim 12 wherein the adhesive structure is out of contact with the edge surface.

15. The assembly of claim 12 wherein the flowable adhesive is in a stenciled pattern on the support surface.

16. The assembly of claim 12 wherein the electrical coupling is a wire bond.

17. A microfeature workpiece assembly, comprising:
    a microfeature workpiece including a microelectronic die, the microfeature workpiece having a first major surface, a second major surface facing away from the first major surface, and an edge surface between the first and second major surfaces;
    a support member having a support surface facing toward the second major surface;
    an adhesive structure including
        a first layer directly attached to the second major surface via a first bond,
        a second layer directly attached to the support surface via a second bond, and
        an internal bond positioned between the first and second bonds, the internal bond being weaker than the first bond and weaker than the second bond; and
    a wire bond extending between the microfeature workpiece and the support member,
    wherein
        the first and second layers have different chemical compositions, and
        the first and second layers are directly bonded to one another via the internal bond.

18. The assembly of claim 17 wherein the second layer is infiltrated into surface features of the support surface to a greater extent than the first layer is infiltrated into surface features of the second major surface.

19. The assembly of claim 17 wherein:
    the first layer includes a portion of a wafer backside laminate; and
    the second layer includes an epoxy.

20. The assembly of claim 17 wherein the second layer is in a stenciled pattern on the support surface.

* * * * *